(12) United States Patent
Kim et al.

(10) Patent No.: US 7,719,742 B2
(45) Date of Patent: May 18, 2010

(54) MEMS DEVICE PACKAGE AND METHOD OF MANUFACTURING THE SAME

(75) Inventors: Jong-seok Kim, Taean-eup (KR); Duck-hwan Kim, Goyang-si (KR); Kuang-woo Nam, Yongin-si (KR); Yun-kwon Park, Dongducheon-si (KR); Seok-chul Yun, Yongin-si (KR); Sung-hoon Choa, Seoul (KR); In-sang Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 214 days.

(21) Appl. No.: 11/368,626

(22) Filed: Mar. 7, 2006

(65) Prior Publication Data

US 2006/0199297 A1      Sep. 7, 2006

(30) Foreign Application Priority Data

Mar. 7, 2005      (KR) .................... 10-2005-0018682

(51) Int. Cl.
*G02B 26/00*      (2006.01)
*G02B 26/08*      (2006.01)

(52) U.S. Cl. .................. 359/237; 359/198; 359/290

(58) Field of Classification Search .................. 359/196, 359/198, 223–225, 237, 254, 290–292, 295
See application file for complete search history.

(56) References Cited

U.S. PATENT DOCUMENTS 6,528,344 B2      3/2003      Kang 6,884,650 B2      4/2005      Lee et al.
7,498,259 B2 *    3/2009      Yamano et al. ............. 438/667
2004/0077117 A1 * 4/2004      Ding et al. .................... 438/51

FOREIGN PATENT DOCUMENTS

| JP | 60-53054 A   |   | 3/1985 |
|----|--------------|---|--------|
| JP | H2-79044     |   | 6/1990 |
| JP | 2002-43463 A |   | 2/2002 |
| JP | 2004-160654 A |  | 6/2004 |
| JP | 2004-191488  | * | 6/2004 |

* cited by examiner

*Primary Examiner*—Scott J Sugarman
*Assistant Examiner*—Dawayne A Pinkney
(74) *Attorney, Agent, or Firm*—Sughrue Mion, PLLC

(57) ABSTRACT

A MEMS device package and a method of manufacturing the same. The MEMS device package includes a device substrate having a surface on which a MEMS active device is formed, and multiple sealing pads arranged around the MEMS active device so that the sealing pads provide electric paths for the MEMS active device. In addition, the MEMS device package may include a cap substrate bonded to the device substrate through the multiple sealing pads, the cap substrate including a trench, within which the MEMS active device is positioned, and via holes. One or more outer electrode pads may be formed on one surface of the cap substrate to be electrically connected with the multiple sealing pads through the via holes. Because there are several bonding and sealing areas between the device substrate and the cap substrate, the sealing intensity is strengthened.

21 Claims, 5 Drawing Sheets

MEMS DEVICE PACKAGE AND METHOD OF MANUFACTURING THE SAME

CROSS-REFERENCE TO RELATED APPLICATIONS

This application claims priority from Korean Patent Application No. 2005-18682, filed Mar. 7, 2005, in the Korean Intellectual Property Office, the entire disclosure of which is incorporated herein by reference.

BACKGROUND OF THE INVENTION

1. Field of the Invention

The present invention relates to a MEMS (Micro Electro-Mechanical System) device package and a method of manufacturing the same.

2. Description of the Related Art

The field of MEMS is a technical field for processing sensors, micro-actuators, gyroscopes, or parts for precise machines using a semiconductor processing technique. Therefore, the use of MEMS is considered as a technique for improving performance and reducing costs as the precise workability, uniformity between products, superior productivity, etc., of the semiconductor technique can be applied to MEMS.

MEMS devices, for example, accelerometers, angular velocity sensors, resonance type gyroscopes, etc. are packaged for the purpose of enhancing protection and/or sensitivity thereof. As high densification and miniaturization of MEMS devices are realized due to the rapid development of techniques for manufacturing MEMS devices, it is also required to miniaturize packages of the MEMS devices. For this purpose, a WSP (Wafer Scale Package) technique is frequently attempted, which performs packaging of devices while the devices are in a wafer condition.

Figure 1:
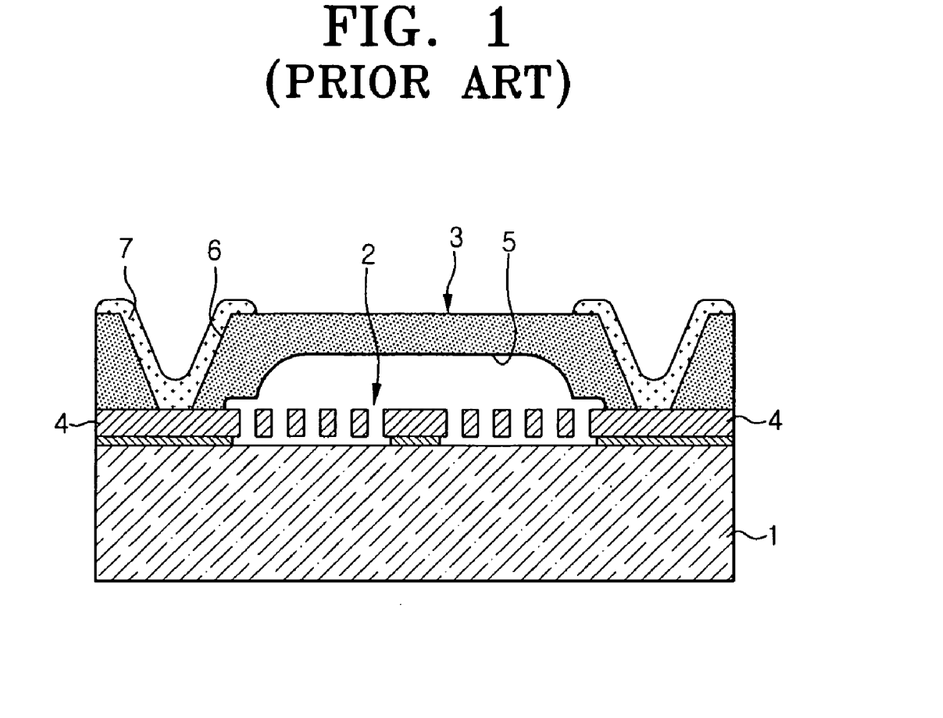
FIG. 1 is a schematic cross-sectional view showing a structure of a conventional MEMS device package.

FIG. 1 is a cross-sectional view schematically showing an example of a conventional MEMS device package. As shown in the drawing, a device substrate is provided with a MEMS active device 2, and a covering glass substrate 3 is joined to the device substrate 1 for protecting the MEMS active device 2. The MEMS active device 2 generally comprises a spring structure and a stage supported by the spring structure.

In addition, inner electrode pads 4 are provided on the opposite side portions of the device substrate 1, in which the inner electrode pads are electrically connected with the MEMS active device 2. Furthermore, a trench 5 is formed in the covering glass substrate 3 to provide a space in which the MEMS active device 2 is positioned, and the covering glass substrate 3 and the device substrate are anodic-bonded to one another.

Furthermore, via holes 6 are formed through the opposite side portions of the covering glass substrate 3 and outer electrode pads 7 are formed through the via holes 6, in which the outer electrode pads 7 are connected with the inner electrode pads 4. Here, the outer electrode pads 7 are formed by filling metal (typically, aluminum (Al)) in the via holes 6 through a sputtering process. The outer electrode pads 7 are each connected with a signal line on a circuit board (not shown) via a wire, a bump or the like.

In the above-mentioned conventional MEMS device package, there is no way to avoid the increase in thickness of the covering glass substrate 3 because a structure and a manufacturing process that the glass-based covering substrate 3 and the silicon-based device substrate 1 are bonded to one another through anodic-bonding are adopted. In addition, there is a limit in reducing the size of the package because the via holes 3 are formed through the glass substrate 3. Consequently, the above-mentioned conventional package contributes to an obstruction in miniaturizing an appliance which employs such a MEMS package, because it is high and large in size and thus occupies a large volume in the appliance.

Furthermore, by employing the glass-based covering substrate 3, the above-mentioned conventional MEMS device package has a problem in that the processes for forming the via holes 6 for electrode-wiring and the outer electrode pads 7 are very complicated and require a lot of time, thereby causing a drop in yield and productivity. The conventional MEMS package also has a problem in that the MEMS active device 2 may be deformed or damaged due to high temperature at the time of anodic-bonding (typically, about 460° C.) and inherent stress is included due to the difference in thermal expansion coefficient between the covering glass substrate 3 and the device substrate 1.

In addition, the circuit connection between the inner electrode pads 4 formed from silicon and the outer electrode pads 7 formed from a metallic material such as aluminum (Al) may present a problem in terms of reliability of the device because such a circuit connection generates very high inductance in connection with the electric contact resistance at the contact areas and RF of high frequency, thereby causing a great signal loss.

Meanwhile, existing bonding materials such as SnPb are spread out laterally when bonding a wafer and a glass material, whereby uniformity may be deteriorated or poor quality may be frequently caused in forming a rim of the package.

SUMMARY OF THE INVENTION

According to one aspect, the present invention provides a MEMS device package which employs a cap substrate formed from the same material as a device substrate, so that stress caused due to the difference in thermal expansion coefficient between the cap substrate and the device substrate, the manufacturing process of the MEMS device package can be simplified, and the size of the MEMS device package can be miniaturized, and a method of manufacturing such a MEMS device package.

Another aspect of the present invention is to provide a MEMS device package, which is enhanced in sealing strength and stability by arranging pads for bonding the device substrate and the cap substrate in many folds, and a method of manufacturing such a MEMS device package.

Still another aspect of the present invention is to provide a MEMS device package which can be minimized in signal loss by employing a circuit connection structure provided by contact between same metals or metals having a high conductivity, and a method of manufacturing such a MEMS device package.

According to another aspect, there is provided a MEMS device package comprising: a device substrate having a surface on which a MEMS active device is formed; multiple sealing pads arranged around the MEMS active device, the sealing pads providing electric paths for the MEMS active device; a cap substrate bonded to the device substrate through the multiple sealing pads, the cap substrate comprising a trench, within which the MEMS active device is positioned, and via holes; and one or more outer electrode pads formed on a surface of the cap substrate to be electrically connected with the multiple sealing pads through the via holes.

The multiple sealing pads are radially arranged around the MEMS active device with an interval being provided between adjacent pads, in which the multiple sealing pads preferably comprise gold (Au) or gold tin (AuTi).

The outer electrode pads also preferably comprise gold (Au) or gold tin (AuTi).

In addition, the inner wall of each via hole is formed with connection metal for electrically interconnecting the multiple sealing pads and the outer electrode pads, in which the connection metal preferably comprises gold (Au) or gold tin (AuTi).

The device substrate and the cap substrate are preferably formed with the same material.

According to another aspect of the present invention, there is provided a method of manufacturing a MEMS device package comprising steps of: a) forming multiple sealing lines on a cap substrate; b) forming via holes at predetermined areas in the cap substrate; c) forming a trench at a predetermined area of the cap substrate; d) forming multiple sealing pads on the multiple sealing lines; e) bonding the cap substrate and a device substrate having a top surface formed with a MEMS active device using the multiple sealing pads; f) polishing the cap substrate to such a thickness that the via holes are exposed; and g) forming one or more outer electrode pads on the cap substrate.

The step a) may comprise steps of: a1) performing photoresist (PR) patterning for forming the multiple sealing lines on the cap substrate; a2) forming plural grooves on the patterned areas through inductively coupled plasma (ICP) etching; and a3) removing the PR.

The step b) may comprise steps of: b1) performing PR patterning for forming the via holes in the cap substrate; and b2) forming the via holes in a predetermined depth in the patterned areas by ICP etching.

The step c) may comprise steps of: c1) performing PR patterning for forming the trench in the cap substrate; and c2) forming the trench in a predetermined depth in the patterned area by reactive ion etching (RIE).

The step d) may comprise steps of: d1) depositing a seed metal layer on the entire top surface of the cap substrate after the multiple sealing lines, via holes and trench are formed; and d2) performing patterning for forming multiple sealing pads and connection meta on the seed metal layer 1. Herein, the step d2) may comprise steps of: d3) performing PR patterning on the top surface of the seed metal layer so that the trench-formed area is exposed; d4) removing the seed metal layer formed in the trench area by dry etching the patterned area; and d5) removing the PR.

In addition, the deposition in the step d1) may be performed by sputtering, wherein gold (Au) or gold tin (AuTi) may be deposited to a thickness of substantially 1 μm.

The predetermined thickness of the cap substrate in the step f) may be substantially 40 μm The step g) may comprise steps of: g1) depositing gold (Au) or gold tin (AuTi) on the top surface of the cap substrate; g2) performing PR patterning for forming the outer electrode pads; g3) removing the gold (Au) or gold tin (AuTi) in the patterned area by dry etching; and g4) removing the PR.

BRIEF DESCRIPTION OF THE DRAWINGS

The above aspects and features of the present invention will be more apparent from the description for certain exemplary embodiments of the present invention taken with reference to the accompanying drawings, in which:

FIGS. 4A to 4L are views for showing manufacturing steps of the MEMS device package according to the exemplary embodiment of the present invention.

DETAILED DESCRIPTION OF ILLUSTRATIVE, NON-LIMITING EMBODIMENTS OF THE INVENTION

Hereinbelow, a MEMS device package according to an exemplary embodiment of the present invention is described in detail with reference to accompanying drawings. The described exemplary embodiments are intended to assist the understanding of the invention and are not intended to limit the scope of the invention in any way.

Figure 2:
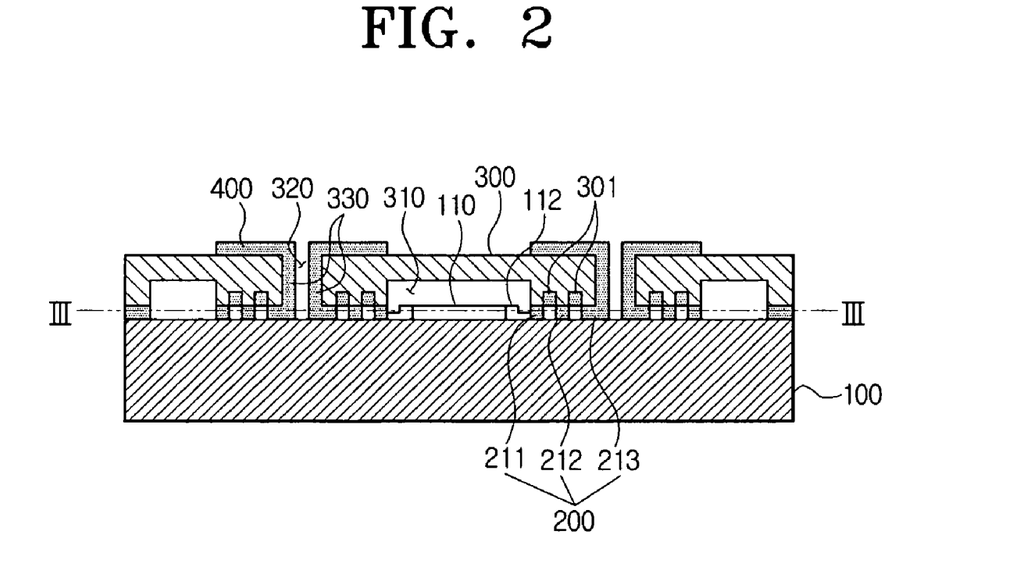
FIG. 2 is a cross-sectional view showing a structure of a MEMS device package according to an exemplary embodiment of the present invention.

FIG. 2 is a schematic cross-sectional view showing a structure of a MEMS device package according to an exemplary embodiment of the present invention. As shown in the drawing, the MEMS device package includes a device substrate 100, multiple sealing pads 200, a cap substrate 300, and outer electrode pads 400. The device substrate 100 and the cap substrate 300 are formed from silicon wafers of an identical material.

A MEMS active device 110 is formed at the center of the top surface of the device substrate 100. Typically, the MEMS active device 110 comprises an elastic member, a stage supported by the elastic member, and electric electrodes for supplying a drive force to the stage or detecting the displacement of the stage. Such a MEMS active device 110 does not limit the technical scope of the present invention. In addition, lead lines 112 electrically connected with the MEMS active device 110 are formed on the device substrate 100.

The multiple sealing pads 200 are arranged around the MEMS active device 110. The multiple sealing pads 200 provide an electrical path of the MEMS active device 110, and also serve as a sealing for protecting the MEMS active device against an outer circumstance or disturbance as the substrate device 100 and the cap substrate 300 are bonded to one another through the multiple sealing pads 200. The multiple sealing pads 200 may be formed form gold (Au) or gold tin (AuTi).

Figure 3:
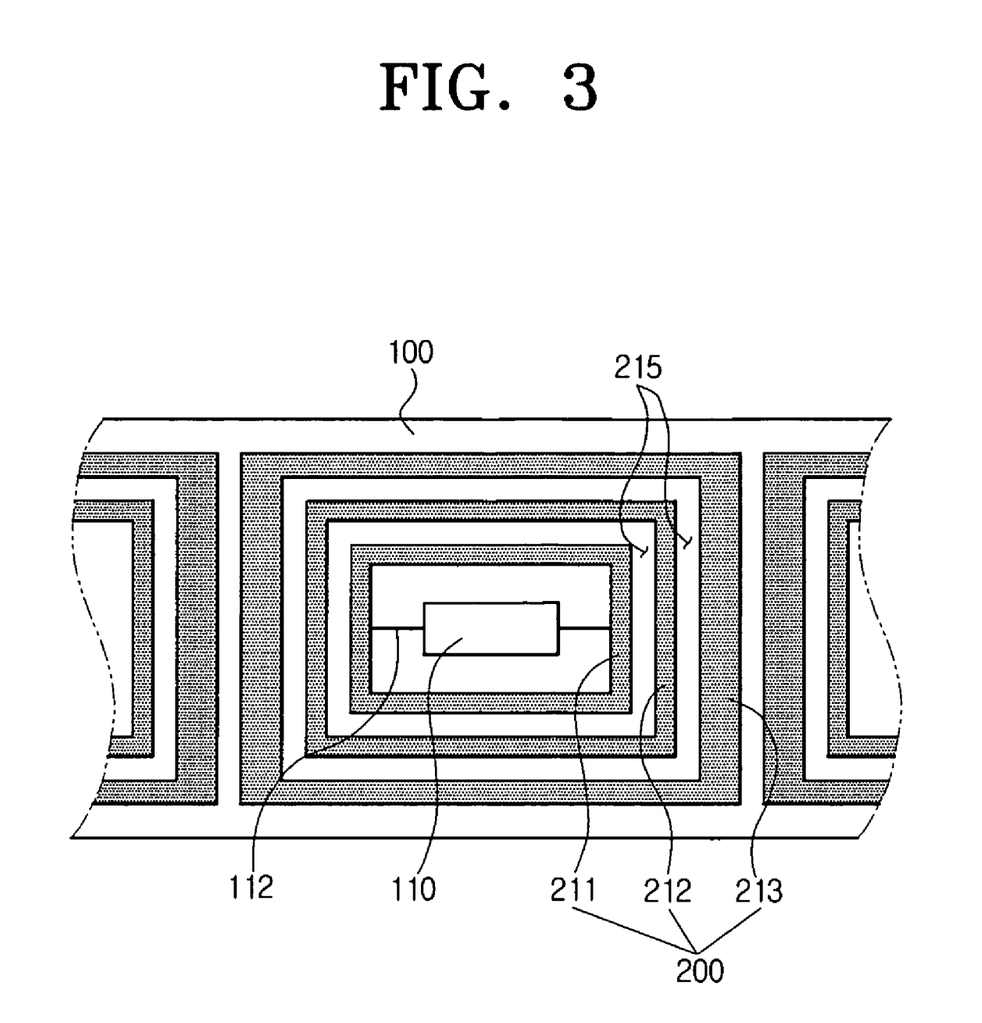
FIG. 3 is a partial top plan view taken in the direction indicated by line III-III.

Referring to FIG. 3, the multiple sealing pads 200 are radially arranged around the MEMS active device 110 with a predetermined interval being provided between adjacent sealing pads. As shown in the drawing, each sealing pad takes a form of a closed curve and such sealing pads surround the MEMS active device 110 in many folds. By arranging plural sealing pads in this manner, there is an effect of strengthening the sealing effect. Although the multiple sealing pads 200 are each arranged in a form of a rectangular closed curve in the present exemplary embodiment, the present invention is not limited to this; it is sufficient that the sealing pads surround the MEMS active device in many folds. For example, it is possible to arrange each of the multiple sealing pads in a form of a circular curve. Among the plural sealing pads 200, the sealing pad 211 most nearly arranged to the MEMS active device 110 is connected with lead lines 112 and the sealing pad 213 most remotely arranged in relation to the MEMS active device 110 is connected with connection members 330 with reference to FIG. 2. Meanwhile, each of the sealing pads 211, 212, 213 are electrically connected with gold (Au) or gold tin (AuTi) formed in grooves 301 of the cap substrate 300.

Referring to FIG. 2, the cap substrate 300 is bonded to the device substrate 100 through the multiple sealing pads 200. By the multiple sealing pads 200 arranged in many folds as described above, the bonding force is reinforced. Meanwhile, the cap substrate 300 is formed with a trench 310 and via holes 320. The MEMS active device 110 is positioned within the trench 310. The via holes 320 are formed at predetermined areas on the plural sealing pads 200, thereby allowing the multiple sealing pads 200 to be electrically connected to an external area. For this purpose, connection metal 320 is formed on the internal peripheral surfaces of the via holes 320 and one end of connection metal 320 is connected with the outermost sealing pad 213 among the multiple sealing pads 200. The connection metal 330 is preferably formed from Au or AuTi, which is same with the material of the multiple sealing pads 200.

The outer electrode pads 400 are formed on the top surface of the cap substrate 300 to be connected with the other end of the connection metal 320. The outer electrode pads 400 are preferably formed from Au or AuTi, which is the same material as the connection metal 300.

The exemplary embodiment of the inventive MEMS device package can stably protect a MEMS active device 100 because the sealing strength is reinforced by applying multiple sealing pads 200 as mentioned above. In addition, by employing a cap substrate 300 formed with the same material as the device substrate 100, it is possible to substantially reduce the weight, thickness, length and size of the MEMS device package, and it is also possible to reduce signal loss because the MEMS device package has electric signal paths, of which the internal resistance is held low. Moreover, because the outer electrode pads 400 are formed on the external surface of the cap substrate 300, the MEMS device package can be mounted on a main board by a direct bonding method, and plural packages can be easily stacked.

Hereinbelow, the method of manufacturing the MEMS device package of the exemplary embodiment of the present invention is described with reference to FIGS. 4A to 4I. In manufacturing the exemplary embodiment of the inventive MEMS device package, laminating, patterning, etc., which is well known in the semiconductor processing field, are applied. Therefore, each process employed for processing the MEMS device package will not be specifically described.

Figure 4A:
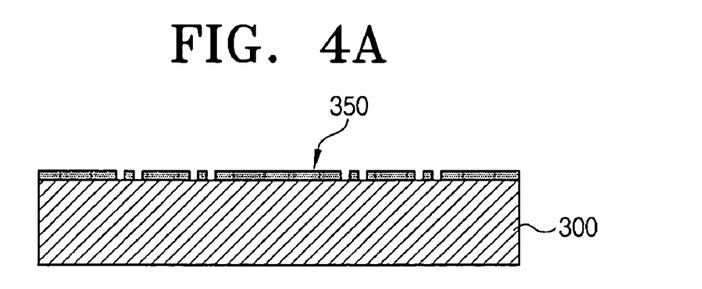
Figure 4B:
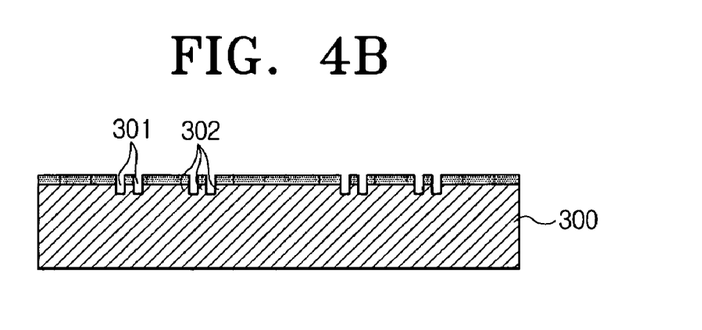

At first, as shown in FIGS. 4A and 4B, an etching process is performed to form the multiple sealing lines 302 on the cap substrate 300. As shown in FIG. 4A, photoresist (PR) patterning 350 is performed so as to form the multiple sealing lines on one surface of the cap substrate 300. Then, as shown in FIG. 4B, ICP (Inductively Coupled Plasma) etching, which is a kind of plasma etching, is performed on predetermined patterned areas, to form plural grooves 301 on the cap substrate 300. The plural grooves are spaced from each other and have a predetermined depth. Between the plural grooves 301 and on the protruded surface of the cap substrate 300 around the grooves 301, the multiple sealing lines 302 are formed. On the surfaces of the multiple sealing lines 302, Au or AuTi is deposited, thereby forming sealing pads 200 to be described later (see FIG. 4H).

Figure 4C:
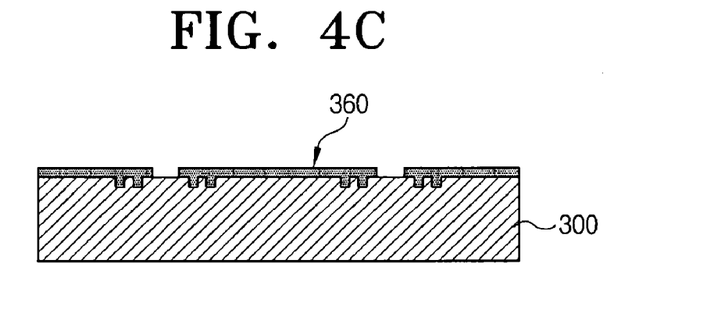
Figure 4D:
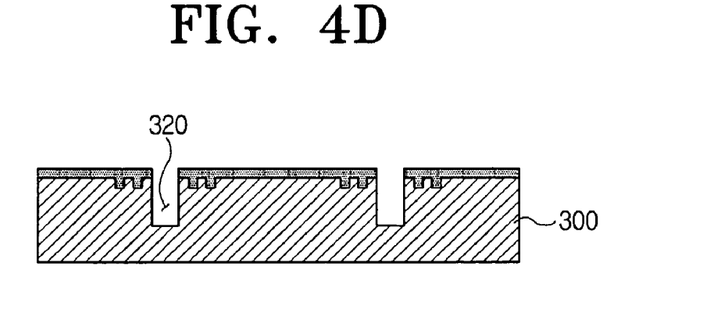

Thereafter, an etching process is performed to form the via holes 320 in the cap substrate 300. After removing the photoresist (PR) used for forming the multiple sealing lines as shown in FIG. 4C, PR patterning 360 for forming the via holes is performed. Then, ICP etching is performed on the patterned areas on the cap substrate as shown in FIG. 4D to form via holes 320 each having a predetermined depth. In the via holes 320, connection metal 330 is formed, which will be described later (see FIG. 4H).

Figure 4E:
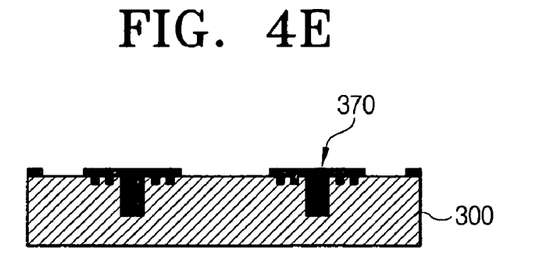
Figure 4F:
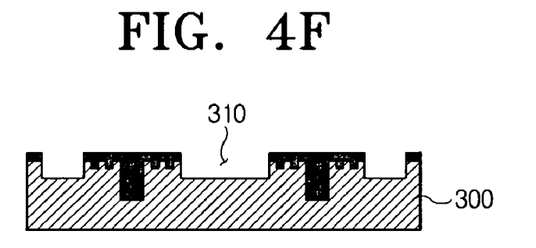

Then, etching is performed to form a trench 310 in the cap substrate 300 as shown in FIGS. 4E and 4F. After removing the PR used for forming the via holes, PR patterning 370 for forming the trench is performed as shown in FIG. 4E. Then, the trench 310 having a predetermined depth is formed through RIE (Reactive Ion Etching) in the patterned area of the cap substrate 300. In the trench 310, a MEMS active device will be positioned, which will be described later.

Figure 4G:
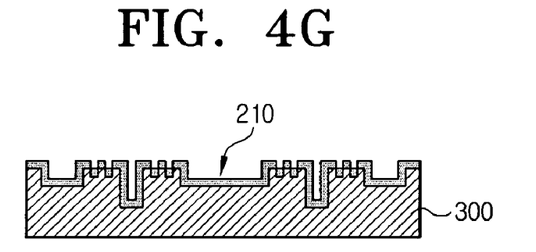
Figure 4H:
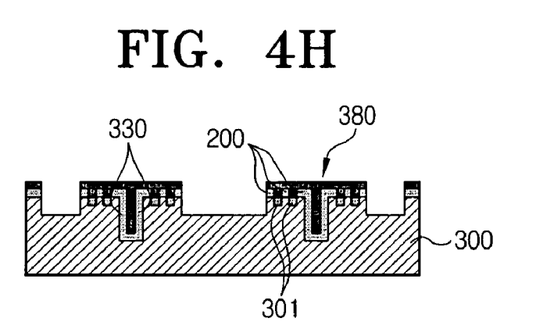

Then, as shown in FIGS. 4G and 4H, multiple sealing members 200 and connection metal 330 are formed on the cap substrate 300. As shown in FIG. 4G, after removing the PR used for forming the trench 310, a seed metal layer 210 is deposited on the entire top surface of the cap substrate 300 through sputtering. The seed metal layer 210 may be formed from Au or AuTi, and may be deposited to a thickness of about 1 μm. Au has a property to be scarcely spread laterally at the time of bonding a wafer to be described later. Therefore, it is possible to solve the problem in the prior art that uniformity in forming rims of a package is deteriorated and poor quality is readily caused because existing bonding materials such as lead-free solder (SnPb) are laterally spread when a wafer is bonded.

The seed metal layer 210 is deposited on the multiple sealing lines, thereby forming the multiple sealing pads 200. The seed metal layer 210 is also attached to inner walls of the via holes 320, thereby forming the connection metal 330. As shown in FIG. 4H, after performing PR patterning 380 for exposing the trench 310 area, the seed metal layer formed in the trench 310 is removed by dry etching. Then, if the PR is removed, the multiple sealing pads 200 and the connection metal 300 are exposed on the top surface of the cap substrate 300 except the trench 310.

Figure 4I:
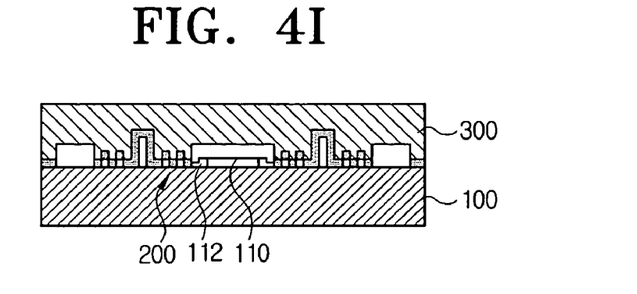

Then, as shown in FIG. 4I, after preparing a device substrate 100 having a MEMS active device 110, the device substrate 100 is bonded to the cap substrate 300 using the multiple sealing members 200. At this time, the MEMS active device 110 is positioned in the space within the trench 310 and the multiple sealing pads 200 are connected with the lead lines 112. Like this, because silicon substrates of a same material are bonded to one another, it is possible to prevent occurrence of stress caused due to difference in thermal expansion coefficient when different materials, e.g., a glass substrate and a silicon substrate, are bonded to one another in the prior art, whereby more stable MEMS device packages can be provided.

Figure 4J:
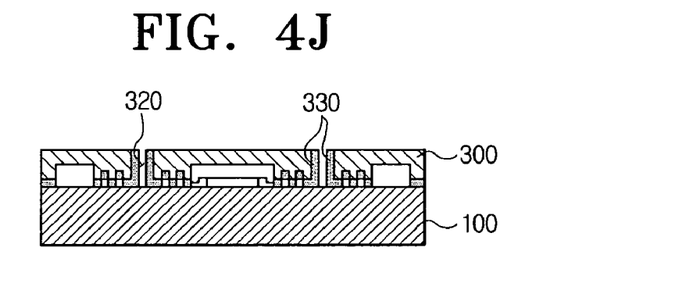

Then, as shown in FIG. 4J, the cap substrate 300 is polished to a predetermined thickness. Here, the predetermined thickness may be about 40 μm. As a result, the via holes 330 and the connection metal 330 formed in the via holes 320 are exposed. Such polishing is performed by a conventional process proceeding in the order of grinding, lapping and chemical and mechanical polishing. If the via holes 320 are partially formed and then the opposite side is polished, it is possible to reduce the number of packaging processes and processing costs.

Figure 4K:
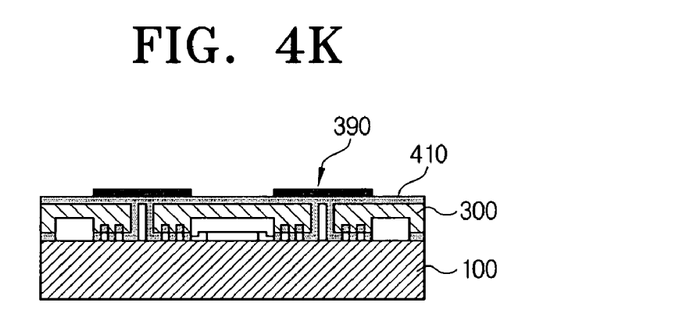
Figure 4L:
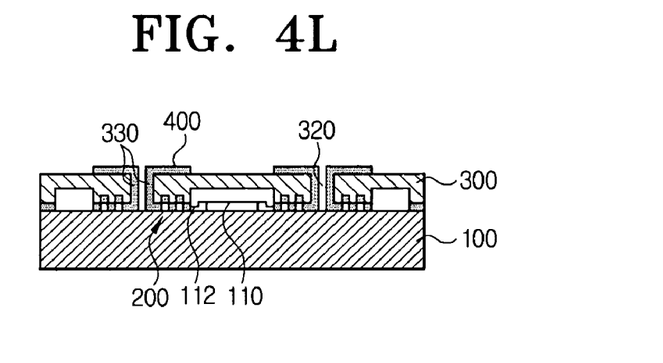

Then, as shown in FIGS. 4K and 4L, outer electrode pads 400 are formed on the cap substrate 300. As shown in FIG. 4K, a metallic material 410 is deposited on the entire top surface of the cap substrate 300. The metallic material 410 may be formed from Au or AuTi, which is same with the materials of the multiple sealing pads 200 and the connection metal 330. Then, PR patterning 390 for forming the outer electrode pads is performed.

Then, if Au is removed from predetermined patterned areas by etching and then the PR is removed, the outer electrode pads 400 are formed on the top surface of the cap substrate 300, as shown in FIG. 4L. As shown in the drawing, the outer electrode pads 400 are electrically connected with the connection metal 330. Consequently, the MEMS active device 110 is electrically connected with the outer electrode pads 400 through the lead lines 112, the multiple sealing pads 200 and the connection metal 330.

Like this, since the electric signal paths of the MEMS active device 110 are formed from a single material such as Au or AuTi, it is possible to solve the problem of high resistance and inductance caused when the signal paths are formed from different materials.

As described above, according to the exemplary embodiments of the present invention, it is possible to provide a light, thin, short and small-sized package, whereby an appliance, to which the package is applied, can be miniaturized.

In addition, by forming bonding and sealing areas between the device substrate and the cap substrate by many folds, the sealing intensity can be strengthened, whereby it is possible to provide a package which is stable and highly reliable in function.

Moreover, by forming the sealing and electrodes using Au or AuTi, it is not needed to separately form inner electrodes, whereby it is possible to save costs because the number of packaging processes is reduced.

Representative exemplary embodiments of the present invention have been shown and described in order to exemplify the principle of the present invention. However, the terms used herein are selected merely to illustrate the present invention and shall not be considered as being intended to limit the present invention. It will be understood that various modifications and changes can be made by one skilled in the art according to the above description. For example, the inventive package can be applied not only to a MEMS device but also to a package for a highly integrated semiconductor device. Accordingly, the present invention can be freely implemented within the scope of the present invention defined by the claims, unless otherwise described. Therefore, it shall be considered that the above-mentioned modifications, changes and equivalents thereof are all included within the scope of the present invention.

What is claimed is:

1. A Micro-Electro Mechanical System (MEMS) device package comprising:
   a device substrate having a surface on which a MEMS active device is formed;
   multiple sealing pads arranged around the MEMS active device;
   a cap substrate bonded to the device substrate through the multiple sealing pads, the cap substrate comprising a trench, within which the MEMS active device is positioned, and via holes; and
   one or more outer electrode pads formed on a surface of the cap substrate to be electrically connected with the multiple sealing pads through the via holes, wherein the sealing pads seal the MEMS active device from an outside of the trench, provide one or more electric paths for the MEMS active device,
   wherein each of the sealing pads encloses the MEMS active device in a form of a continuously connected closed curve, and
   wherein the sealing pads are disposed on and below an undersurface of the cap substrate, and between the trench and the via holes.

2. A MEMS device package as claimed in claim 1, wherein the multiple sealing pads are radially arranged around the MEMS active device such that an innermost sealing pad encloses the MEMS active device in a form of a continuously connected closed curve, and an outermost sealing pad encloses the inner-most sealing pad in a form of a continuously connected-closed curve, and wherein an interval is provided between adjacent sealing pads.

3. A MEMS device package as claimed in claim 1, wherein the multiple sealing pads comprise gold (Au) or gold tin (AuTi).

4. A MEMS device package as claimed in claim 1, wherein the outer electrode pads comprise gold (Au) or gold tin (AuTi).

5. A MEMS device package as claimed in claim 4, wherein inner walls of the via holes are formed with connection metal for electrically interconnecting the multiple sealing pads and the outer electrode pads.

6. A MEMS device package as claimed in claim 5, wherein the connection metal comprises gold (Au) or gold tin (AuTi).

7. A MEMS device package as claimed in claim 1, wherein the device substrate and the cap substrate are formed with the same material.

8. A MEMS device package as claimed in claim 1, wherein the sealing pads protect the MEMS active device from an external circumstance.

9. A MEMS device package as claimed in claim 1, wherein an outermost sealing pad of the sealing pads is formed to be electrically connected to the outer electrode pads, and an innermost sealing pad of the sealing pads is formed to be electrically connected to the MEMS active device.

10. A method of manufacturing a Micro-Electro Mechanical System (MEMS) device package comprising steps of:
   a) forming multiple sealing lines on a cap substrate;
   b) forming via holes at predetermined areas in the cap substrate;
   c) forming a trench at a predetermined area of the cap substrate;
   d) forming multiple sealing pads on the multiple sealing lines;
   e) bonding the cap substrate and a device substrate having a top surface formed with a MEMS active device using the multiple sealing pads;
   f) polishing the cap substrate to such a thickness that the via holes are exposed; and
   g) forming one or more outer electrode pads on the cap substrate,
   wherein the sealing pads are formed to seal the MEMS active device from an outside of the trench and provide one or more electric paths for the MEMS active device,
   wherein each of the sealing pads is formed to enclose the MEMS active device in a form of a continuously connected closed curve, and
   wherein the sealing pads are disposed on and below an undersurface of the cap substrate, and between the trench and the via holes.

11. A method as claimed in claim 10, wherein the step a) comprises steps of:
   a1) performing photoresist (PR) patterning for forming the multiple sealing lines on the cap substrate;
   a2) forming plural grooves on the patterned areas through inductively coupled plasma (ICP) etching; and
   a3) removing the PR.

12. A method as claimed in claim 10, wherein the step b) comprises steps of:
   b1) performing PR patterning for forming the via holes in the cap substrate; and
   b2) forming via holes of a predetermined depth in the patterned areas by ICP etching.

13. A method as claimed in claim 10, wherein the step c) comprises steps of:
   c1) performing PR patterning for forming the trench in the cap substrate; and c2) forming the trench of a predetermined depth in the patterned area by reactive ion etching (RIE).

14. A method as claimed in claim 10, wherein the step d) comprises steps of:
- d1) depositing a seed metal layer on the entire top surface of the cap substrate after the multiple sealing lines, the via holes and the trench are formed; and
- d2) performing patterning for forming multiple sealing pads and connection metal on the seed metal layer.

15. A method as claimed in claim 14, wherein the step d2) comprises steps of:
- d3) performing PR patterning on the top surface of the seed metal layer so that the trench-formed area is exposed;
- d4) removing the seed metal layer formed in the trench area by dry etching the patterned area; and
- d5) removing the PR.

16. A method as claimed in claim 14, wherein the deposition in the step d1) is performed by sputtering.

17. A method as claimed in claim 14, wherein in the step d1), gold (Au) or gold tin (AuTi) is deposited to a thickness of substantially 1 μm.

18. A method as claimed in claim 10, wherein in the step e), the cap substrate and the device substrate are bonded to one another so that the MEMS active device is positioned within the trench.

19. A method as claimed in claim 10, wherein the predetermined thickness in the step f) is substantially 40 μm.

20. A method as claimed in claim 10, wherein the step g) comprises steps of:
- g1) depositing gold (Au) or gold tin (AuTi) on the top surface of the cap substrate;
- g2) performing PR patterning for forming the outer electrode pads;
- g3) removing the gold (Au) or gold tin (AuTi) in the patterned area by dry etching; and
- g4) removing the PR.

21. A method as claimed in claim 10, wherein an outermost sealing pad of the sealing pads is formed to be electrically connected to the outer electrode pads, and an innermost sealing pad of the sealing pads is formed to be electrically connected to the MEMS active device.

* * * * *